United States Patent
Hu et al.

(10) Patent No.: US 12,364,143 B2
(45) Date of Patent: Jul. 15, 2025

(54) DISPLAY PANEL, MANUFACTURING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Jingyuan Hu, Guangdong (CN); Fanjing Wu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/758,981

(22) PCT Filed: Jul. 7, 2022

(86) PCT No.: PCT/CN2022/104428
§ 371 (c)(1),
(2) Date: Jul. 17, 2022

(87) PCT Pub. No.: WO2023/240718
PCT Pub. Date: Dec. 21, 2023

(65) Prior Publication Data
US 2024/0196694 A1 Jun. 13, 2024

(30) Foreign Application Priority Data
Jun. 16, 2022 (CN) .......................... 202210721317.9

(51) Int. Cl.
*H10K 59/80* (2023.01)
*H10K 59/12* (2023.01)
*H10K 59/124* (2023.01)

(52) U.S. Cl.
CPC ... *H10K 59/80518* (2023.02); *H10K 59/1201* (2023.02); *H10K 59/124* (2023.02)

(58) Field of Classification Search
CPC ......... H10K 59/80518; H10K 59/1201; H10K 59/124
(Continued)

(56) References Cited

U.S. PATENT DOCUMENTS

| | | | |
|---|---|---|---|
| 2012/0061652 A1* | 3/2012 | Sugisawa | H10K 50/828 257/40 |
| 2014/0175394 A1 | 6/2014 | Kum | |

(Continued)

FOREIGN PATENT DOCUMENTS

| | | |
|---|---|---|
| CN | 101221974 A | 7/2008 |
| CN | 101499516 A | 8/2009 |

(Continued)

OTHER PUBLICATIONS

Japanese Office Action issued in corresponding Japanese Patent Application No. 特願 2022-546046 dated Jul. 23, 2024, pp. 1-5.

(Continued)

*Primary Examiner* — Xia L Cross
(74) *Attorney, Agent, or Firm* — PV IP PC; Wei Te Chung

(57) ABSTRACT

A display panel, a manufacturing method thereof, and a display device are provided. The display panel includes a substrate, an organic planarization layer, an anode, a light-emitting layer, and a cathode arranged in sequence. The anode includes a hydrogen barrier layer, a reflective layer, and an electrode layer arranged in sequence on the organic planarization layer. A reducibility of a metal in the reflective layer is greater than a reducibility of hydrogen. A material of the hydrogen barrier layer is metal or alloy, wherein a (Continued)

reducibility of a metal in the hydrogen barrier layer is less than the reducibility of hydrogen.

20 Claims, 5 Drawing Sheets

(58) Field of Classification Search
USPC .......................................................... 257/43
See application file for complete search history.

(56) References Cited

U.S. PATENT DOCUMENTS

| | | | |
|---|---|---|---|
| 2017/0092710 A1 | 3/2017 | Abe et al. | |
| 2019/0088794 A1* | 3/2019 | Jeong | H10D 30/6734 |
| 2021/0202889 A1 | 7/2021 | Lee et al. | |
| 2023/0159413 A1* | 5/2023 | Ohrui | C07C 15/28 |
| | | | 428/690 |

FOREIGN PATENT DOCUMENTS

| | | |
|---|---|---|
| CN | 103887440 A | 6/2014 |
| CN | 106531768 A | 3/2017 |
| CN | 109244274 A | 1/2019 |
| CN | 110571352 A | 12/2019 |
| CN | 111653603 A | 9/2020 |
| CN | 112259610 A | 1/2021 |
| JP | 2003317971 A | 11/2003 |
| JP | 2009-238759 A | 10/2009 |
| JP | 2013246248 A | 12/2013 |
| JP | 2017195349 A | 10/2017 |
| JP | 2020052394 A | 4/2020 |
| JP | 2020194758 A | 12/2020 |
| WO | 2021254319 A1 | 12/2021 |

OTHER PUBLICATIONS

Chinese Office Action issued in corresponding Chinese Patent Application No. 202210721317.9 dated Dec. 21, 2024, pp. 1-7.
Japanese Office Action issued in corresponding Japanese Patent Application No. 特願 2022-546046 dated Dec. 17, 2024, pp. 1-5.
International Search Report in International application No. PCT/CN2022/104428, mailed on Dec. 27, 2022.
Written Opinion of the International Search Authority in International application No. PCT/CN2022/104428, mailed on Dec. 27, 2022.

* cited by examiner

DISPLAY PANEL, MANUFACTURING METHOD THEREOF, AND DISPLAY DEVICE

FIELD OF INVENTION

The present application relates to a field of display technology, and in particular, to a display panel, a manufacturing method thereof, and a display device.

BACKGROUND OF INVENTION

For a top-emitting active-matrix organic light-emitting diode (AMOLED) display product, a planarization layer is usually arranged between the thin film transistor and the anode to improve an overall flatness of the film layer. However, because a material of the planarization layer is an organic material, the planarization layer would absorb water vapor generated in an external environment or in the product manufacturing process, so that there is a small amount of water vapor inside the planarization layer.

In the top-emitting AMOLED display panel of the prior art, the anode is usually a laminated structure of a reflective film and an electrode layer. The reflective film is positioned on a side of the electrode layer close to the planarization layer, and a material of the reflective film is generally a metal with high reflectivity. Due to a strong activity of metals such as aluminum used in the reflective film material, under a high temperature process in the electrode layer film manufacturing process, the planarization layer and the reflective film will ionize the water in the planarization layer to generate hydrogen ion due to direct contact. A channel is conduction into a conductor when hydrogen ions diffuse into the channel of the oxide semiconductor layer in a direction close to the thin film transistor, resulting in a serious negative drift in the electrical properties of the thin film transistor, thereby reducing an electrical stability of the thin film transistor.

SUMMARY OF INVENTION

Embodiments of the present application provide a display panel, a manufacturing method, and a display device, to improve an electrical stability of the thin film transistor.

Embodiments of the present application provide a display panel, including:
  a substrate;
  a metal oxide thin film transistor disposed on the substrate;
  an organic planarization layer disposed on a side of the metal oxide thin film transistor away from the substrate, wherein a through hole is provided in the organic planarization layer;
  an anode disposed on a side of the organic planarization layer away from the metal oxide thin film transistor, wherein the anode covers the through hole, and wherein the anode is connected to the metal oxide thin film transistor;
  a light-emitting layer disposed on a side of the anode away from the organic planarization layer; and
  a cathode disposed on a side of the light-emitting layer away from the anode;
  wherein the anode includes a hydrogen barrier layer, a reflective layer, and an electrode layer sequentially disposed on the organic planarization layer, wherein a reducibility of a metal in the reflective layer is greater than a reducibility of hydrogen, wherein a material of the hydrogen barrier layer is metal or alloy, and wherein a reducibility of a metal in the hydrogen barrier layer is less than the reducibility of hydrogen.

Optionally, in some embodiments of the present application, the metal in the hydrogen barrier layer includes at least one of Mo, Ti and Ni.

Optionally, in some embodiments of the present application, the material of the hydrogen barrier layer includes Mo/Ti alloy, Mo/Ni alloy or Mo/Ti/Ni alloy.

Optionally, in some embodiments of the present application, the metal in the reflective layer includes Al.

Optionally, in some embodiments of the present application, the metal in the reflective layer further includes at least one of Ni, Cu, and La.

Optionally, in some embodiments of the present application, the material of the reflective layer includes Al/Ni/Cu/La alloy, and wherein the material of the hydrogen barrier layer includes Mo/Ni/Ti alloy.

Optionally, in some embodiments of the present application, the display panel further includes a passivation layer and a first protective electrode, wherein the passivation layer is disposed between the metal oxide thin film transistor and the organic planarization layer, wherein a first connection hole is provided in the passivation layer, wherein the first protection electrode is disposed between the passivation layer and the organic planarization layer, wherein the first protection electrode covers the first connection hole, and wherein the first protection electrode connected to the anode and the metal oxide thin film transistor respectively.

Optionally, in some embodiments of the present application, the metal oxide thin film transistor includes an oxide semiconductor layer, a gate insulating layer, a gate electrode and a source-drain electrode which are sequentially disposed on the substrate; wherein the display panel further includes a dielectric insulating layer disposed between the gate electrode and the source-drain electrode, and wherein the dielectric insulating layer is in contact with surfaces of the gate electrode and the source-drain electrode, respectively.

One embodiment of the present application provides a display device, the display device includes a housing and a display panel disposed in the housing, where the display panel is the display panel described in any of the foregoing embodiments.

Embodiments of the present application also provide a method of manufacturing a display panel, including the following steps:
  providing a substrate;
  forming a metal oxide thin film transistor on a side of the substrate;
  forming an organic planarization layer on the metal oxide thin film transistor, wherein a through hole is provided in the organic planarization layer;
  forming a hydrogen barrier base layer, a reflective base layer, and an electrode base layer sequentially on the organic planarization layer; wherein a reducibility of a metal in the reflective base layer is greater than a reducibility of hydrogen, wherein a material of the hydrogen barrier base layer is metal or alloy, and wherein a reducibility of a metal in the hydrogen barrier base layer is less than the reducibility of hydrogen;
  annealing the hydrogen barrier base layer, the reflective base layer, and the electrode base layer;
  patterning the hydrogen barrier base layer, the reflective base layer, and the electrode base layer, wherein the hydrogen barrier base layer is formed to a hydrogen barrier layer, the reflective base layer is formed to a reflective layer, and the electrode base layer is formed to an electrode layer, wherein the hydrogen barrier layer, the reflection layer, and the electrode layer constitute an anode, and wherein the anode covers the through hole and is connected to the metal oxide thin film transistor; and forming a light-emitting layer and a cathode sequentially on the anode.

Optionally, in some embodiments of the present application, a material of the reflective base layer includes Al/Ni/Cu/La alloy, a material of the hydrogen barrier base layer includes Mo/Ni/Ti alloy, and wherein the step of patterning the hydrogen barrier base layer, the reflective base layer, and the electrode base layer includes:

etching the electrode base layer by a dry etching process to form the electrode layer; and etching the reflective base layer and the hydrogen barrier base layer under a same wet etching process to form the reflective layer and the hydrogen barrier layer, respectively.

Compared with the display panel in the prior art, in the display panel provided by the present application, a hydrogen barrier layer is disposed between the organic planarization layer and the reflective layer, and a reducibility of the metal in the hydrogen barrier layer is less than a reducibility of hydrogen, compared with metals with strong reactivity that are more reducible than hydrogen, the reactivity of the metal in the hydrogen barrier layer is weaker. Therefore, under a high temperature process in the electrode layer film manufacturing process, the water in the organic planarization layer cannot be ionized to generate hydrogen ions, thereby preventing the hydrogen ions from diffusing into the channel and preventing the channel to be conducted, thereby reducing a probability of an electrical property negative drift of the thin film transistor and improving an electrical stability of the thin film transistor.

DESCRIPTION OF FIGURES

In order to illustrate the technical solutions in the embodiments of the present application more clearly, the following briefly introduces the figures that are used in the description of the embodiments. Obviously, the figures in the following description are only some embodiments of the present application. For those skilled in the art, other figures can also be obtained from these figures without inventive steps.

DETAILED DESCRIPTION OF EMBODIMENTS

The technical solutions in the embodiments of the present application will be clearly and completely described below with reference to the figures in the embodiments of the present application. Obviously, the described embodiments are only a part of the embodiments of the present application, rather than all the embodiments. Based on the embodiments in the present application, all other embodiments obtained by those skilled in the art without inventive step fall within a protection scope of the present application. In addition, it should be understood that the specific embodiments described herein are only used to illustrate and explain the present application, but not to limit the present application. In the present application, unless otherwise stated, the directional words used such as "upper" and "lower" generally refer to the upper and lower sides of the device in actual use or operating state, specifically the figure direction in the accompanying figures. "inside" and "outside" refer to an outline of the device.

Figure 1:
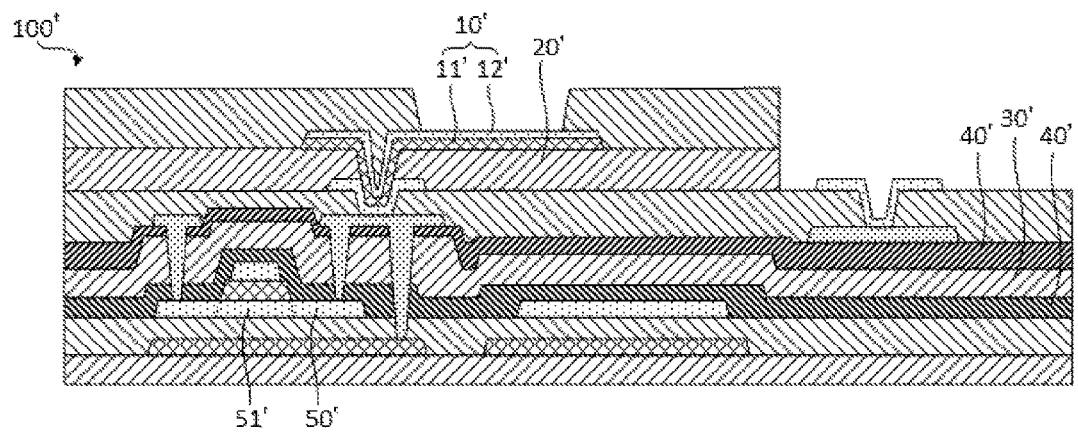
FIG. 1 is a schematic structural diagram of a display panel in the prior art.

As shown in FIG. 1, in the prior art organic light-emitting diode display panel 100', the anode 10' is a laminated structure of a reflective film 11' and an electrode layer 12'. A material of the reflective film 11' is an active metal with high reflectivity such as aluminum or an alloy containing an active metal. A material of the electrode layer 12' is a metal oxide. Specifically, a manufacturing process of the anode 10' includes: first, forming a reflective film and a metal layer on an entire surface; secondly, performing high-temperature annealing treatment in an oxygen atmosphere, so that the metal in the metal layer is oxidized to form a metal oxide, so the metal oxide is used as the electrode material of the anode 10'. Finally, the patterned reflective film 11' and the patterned electrode layer 12' are formed by patterning. However, under the above high temperature conditions, the water in the planarization layer 20' is ionized to generate hydrogen ions because the planarization layer 20' and the reflective film 11' are in direct contact, dense aluminum oxide layers 40' are respectively disposed on an upper surface and a lower surface of the dielectric insulating layer 30' to block a diffusion of hydrogen ions in the planarization layer 20' into the oxide semiconductor layer 50', thereby effectively protecting the channel 51' and preventing the channel 51' from being conductive.

However, in view of the above design, the inventor of the present application found that the arrangement of the aluminum oxide layer 40' has the following technical problems: First, the arrangement of the aluminum oxide layer 40' adds a new manufacturing process, thereby adding a process cost. For example, since a physical vapor deposition process needs to be used in the film manufacturing process of the aluminum oxide layer 40', a use of physical vapor deposition equipment will significantly increase the equipment cost. Second, since a raw material used in the aluminum oxide film manufacturing process is an aluminum oxide target, and there are aluminum particles in the aluminum oxide target, there are foreign objects in a system of the film forming process, which will cause dark spots on the display panel, reducing a product manufacturing yield. Third, since the openings of the dielectric insulating layer 30' are formed by an etching process, the setting of the aluminum oxide layer 40' makes the process parameters in the above etching process need to be readjusted, thereby increasing a burden on the production capacity.

In view of the above-mentioned technical problems existing in the prior art, the present application provides a display panel, a method of manufacturing the display panel, and a display device. Each of them will be described in detail below.

The present application provides a display panel, which includes a substrate, a metal oxide thin film transistor, an organic planarization layer, an anode, a light-emitting layer, and a cathode. The metal oxide thin film transistor is disposed on the substrate. The organic planarization layer is disposed on a side of the metal oxide thin film transistor away from the substrate. A through hole is provided in the organic planarization layer. The anode is disposed on a side of the organic planarization layer away from the metal oxide thin film transistor. The anode covers the through hole and is connected to the metal oxide thin film transistor. The light-emitting layer is disposed on a side of the anode away from the organic planarization layer. The cathode is disposed on a side of the light-emitting layer away from the anode. The anode includes a hydrogen blocking layer, a reflective layer and an electrode layer which are sequentially disposed on the organic flat layer. A reducibility of a metal in the reflective layer is greater than a reducibility of hydrogen. A material of the hydrogen barrier layer is metal or alloy, and a reducibility of a metal in the hydrogen barrier layer is less than the reducibility of hydrogen.

Therefore, in the display panel provided by the present application, the hydrogen barrier layer is disposed between the organic planarization layer and the reflective layer, and the reducibility of the metal in the hydrogen barrier layer is less than the reducibility of hydrogen, compared with metals with strong reactivity that are more reducible than hydrogen, the reactivity of the metal in the hydrogen barrier layer is weaker. Therefore, under a high temperature process in the electrode layer film manufacturing process, the water in the organic planarization layer cannot be ionized to generate hydrogen ions, thereby preventing the hydrogen ions from diffusing into the channel and preventing the channel to be conducted, thereby reducing a probability of an electrical property negative drift of the thin film transistor and improving an electrical stability of the thin film transistor The display panel provided by the present application will be described in detail below through specific embodiments.

Figure 2:
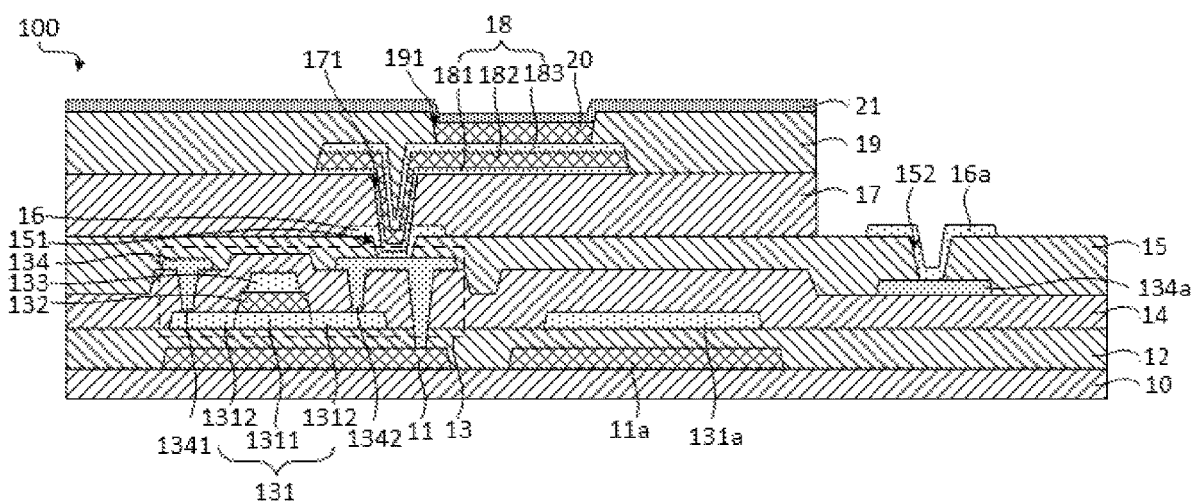
FIG. 2 is a schematic structural diagram of a display panel provided by one embodiment of the present application.

Referring to FIG. 2, one embodiment of the present application provides a display panel 100. The display panel 100 includes a substrate 10, a light-shielding electrode 11, a buffer layer 12, a metal oxide thin film transistor 13, a dielectric insulating layer 14, a passivation layer 15, a first protective electrode 16, an organic planarization layer 17, an anode 18, a pixel definitions layer 19, a light-emitting layer 20, and a cathode 21.

The substrate 10 may be a rigid substrate, such as a glass substrate; or, the substrate 10 may also be a flexible substrate, such as a polyimide substrate, and a material of the substrate 10 is not specifically limited in the present application.

The light-shielding electrode 11 is provided on a side of the substrate 10. A material of the light-shielding electrode 11 may be Mo, Ti, Cu or Mn, or a material of the light-shielding electrode 11 may also be an alloy composed of at least two metals mentioned above.

The buffer layer 12 is disposed on a side of the light-shielding electrode 11 away from the substrate 10. The buffer layer 12 may be a single-layer structure, a double-layer structure, or a multi-layer structure. A material of the buffer layer 12 may include one or more of silicon oxide, silicon nitride, and silicon oxynitride. Exemplarily, when the buffer layer 12 is a double-layer structure, the double-layer structure may include a bottom layer using silicon oxide as an insulating material and a top layer using silicon nitride as an insulating material.

The metal oxide thin film transistor 13 is disposed on a side of the buffer layer 12 away from the light-shielding electrode 11. The metal oxide thin film transistor 13 includes an oxide semiconductor layer 131, a gate insulating layer 132, a gate electrode 133, and a source-drain electrode 134.

It should be noted that the metal oxide thin film transistor 13 in the present application may be a top gate type structure or a bottom gate type structure, and this embodiment only takes the metal oxide thin film transistor 13 of the top gate type structure as an example for description, but it should not be construed as a limitation on the present application.

The oxide semiconductor layer 131 is provided on the buffer layer 12. The oxide semiconductor layer 131 includes a channel 1311 and conduction portions 1312 provided on opposite sides of the channel 1311. A material of the oxide semiconductor layer 131 includes metal oxides, such as one or more of IGZO, IGTO, IZTO, IGZTO, ITO and IZO. In this embodiment, the material of the oxide semiconductor layer 131 is IGZO.

The gate insulating layer 132 is provided on a side of the oxide semiconductor layer 131 away from the buffer layer 12. A material of the gate insulating layer 132 may include one or more of silicon oxide, silicon nitride and silicon oxynitride. Exemplarily, when the gate insulating layer 132 has a double-layer structure, the double-layer structure may include a bottom layer using silicon oxide as an insulating material and a top layer using silicon nitride as an insulating material.

The gate electrode 133 is provided on a side of the gate insulating layer 132 away from the oxide semiconductor layer 131. The gate electrode 133 may have a single-layer structure, a double-layer structure or a multi-layer structure. A material of the gate electrode 133 may include one or more of Cu, Al, Mo, and Ti. Exemplarily, when the gate electrode 133 has a double-layer structure, the double-layer structure may include a bottom layer using Mo as a conductive material and a top layer using Cu as a conductive material.

The source-drain electrode 134 is disposed on a side of the gate electrode 133 away from the gate insulating layer 132. The source-drain electrode 134 include a source electrode 1341 and a drain electrode 1342. The source electrode 1341 is connected to a conduction portion 1312 on a side of the channel 1311. The drain electrode 1342 is connected to a conduction portion 1312 on the other side of the channel 1311. Specifically, the source-drain electrode 134 may have a single-layer structure, a double-layer structure or a multi-layer structure. A material of the source-drain electrode 134 may include one or more of Cu, Al, Mo, and Ti. Exemplarily, when the source-drain electrode 134 have a double-layer structure, the double-layer structure may include a bottom layer using Mo as a conductive material and a top layer using Cu as a conductive material.

It should be noted that, in the present embodiment, the display panel 100 further includes bonding pads 134a which are arranged in a same layer as the source-drain electrode 134 and are spaced apart. The bonding pads 134a are disposed in a bonding region (not marked in the figure), and the related technologies are all in the prior art, which will not be repeated here.

Further, in this embodiment, the display panel 100 further includes a first conductive portion 11a and a second conductive portion 131a. The first conductive portion 11a and the light-shielding electrode 11 are disposed in a same layer and arranged at intervals. The second conductive portion 131a and the oxide semiconductor layers 131 are disposed in a same layer and arranged at intervals. An orthographic projection of the first conductive portion 11a on a plane of the substrate 10 and an orthographic projection of the second conductive portion 131a on a plane of the substrate 10 are at least partially overlapped, so that a capacitance is formed between the first conductive portion 11a and the second conductive portion 131a. The first conductive portion 11a and the light-shielding electrode 11 are manufactured by a same process, the second conductive portion 131a and the oxide semiconductor layer 131 are manufactured by a same process, so as to save a manufacturing cost.

The dielectric insulating layer 14 is disposed between the gate electrode 133 and the source-drain electrode 134. A material of the dielectric insulating layer 14 may include one or more of silicon oxide, silicon nitride, and silicon oxynitride. Exemplarily, when the dielectric insulating layer 14 is a double-layer structure, the double-layer structure may include a bottom layer using silicon oxide as an insulating material and a top layer using silicon nitride as an insulating material.

The passivation layer 15 is disposed on a side of the source-drain electrode 134 away from the dielectric insulating layer 14. A first connection hole 151 and a second connection hole 152 are provided in the passivation layer 15. The first connection hole 151 exposes the drain electrode 1342. The second connection hole 152 exposes the bonding pad 134a. The passivation layer 15 may be a single-layer structure, a double-layer structure or a multi-layer structure. A material of the passivation layer 15 may include one or more of silicon oxide, silicon nitride and silicon oxynitride. Exemplarily, when the passivation layer 15 has a double-layer structure, the double-layer structure may include a bottom layer using silicon oxide as an insulating material and a top layer using silicon nitride as an insulating material.

The first protective electrode 16 is disposed on a side of the passivation layer 15 away from the source-drain electrode 134. The first protection electrode 16 covers the first connection hole 151 and is connected to the drain electrode 1342. In this embodiment, a material of the first protective electrode 16 may be a metal with better corrosion resistance such as Ti. Further, the display panel 100 further includes a second protection electrode 16a, wherein the second protection electrode 16a and the first protection electrode 16 are disposed in a same layer and arranged at intervals, and are formed in a same process. The second protection electrode 16a extends into the second connection hole 152 and is connected to the bonding pad 134a.

The organic planarization layer 17 is disposed on a side of the metal protection layer away from the passivation layer 15. A through hole 171 is provided in the organic planarization layer 17. The through hole 171 communicates with the first connection hole 151. A material of the organic planarization layer 17 may be an organic material such as acrylic resin or epoxy resin.

The anode 18 is disposed on a side of the organic planarization layer 17 away from the metal protective layer. The anode 18 extends into the through hole 171 and is connected to the first guard electrode 16. The anode 18 includes a hydrogen barrier layer 181, a reflective layer 182, and an electrode layer 183 which are sequentially disposed on the organic planarization layer 17.

In this embodiment, a material of the hydrogen barrier layer 181 is metal or alloy. A reducibility of a metal in the hydrogen barrier layer 181 is lower than a reducibility of hydrogen. Specifically, when the material of the hydrogen barrier layer 181 is metal, a reducibility of the metal is lower than the reducibility of hydrogen; when the material of the hydrogen barrier layer 181 is an alloy, a reducibility of at least one metal in the alloy is lower than the reducibility of hydrogen.

Through the above arrangement, compared to a high activity metal which has a greater reducibility than the hydrogen, a metal in the hydrogen barrier layer 181 has a weaker activity. Even under high temperature conditions, a contact between the hydrogen barrier layer 181 and the organic planarization layer 17 will not cause the water in the organic planarization layer 17 to be ionized to form hydrogen ions, which can effectively prevent the hydrogen ions from diffusing into the channel 1311, thereby preventing the channel 1311 from being conductive, and reducing a probability of an electrical property negative drift of the metal oxide thin film transistor 13, thereby improving an electrical stability of the metal oxide thin film transistor 13.

It should be noted that in the present application, the activity of metals is relative, that is, based on a relative magnitude of the reducibility of metals and the reducibility of hydrogen, if the reducibility of metal is greater than the reducibility of hydrogen, the metal has a stronger reducibility; if the reducibility of the metal is less than the reducibility of hydrogen, the metal has a weaker reducibility.

A metal in the hydrogen barrier layer 181 may include at least one of Mo, Ti, and Ni. In some specific embodiments, a material of the hydrogen barrier layer 181 may be metal, such as Mo, Ti or Ni. In addition, in some specific embodiments, the material of the hydrogen barrier layer 181 may also be an alloy, such as a Mo/Ti alloy, a Mo/Ni alloy or a Mo/Ti/Ni alloy. In this embodiment, the material of the hydrogen barrier layer 181 is Mo/Ti/Ni alloy.

Further, a thickness of the hydrogen barrier layer 181 may range from 300 angstroms to 2000 angstroms. Within the above thickness range, the hydrogen barrier layer 181 has a better hydrogen blocking effect and can maintain good conductivity with the reflective layer 182. In some embodiments, the thickness of the hydrogen barrier layer 181 may be 300 angstroms, 500 angstroms, 800 angstroms, 1000 angstroms, 1200 angstroms, 1500 angstroms, 1800 angstroms, or 2000 angstroms.

A material of the reflective layer 182 may be metal or alloy. When the material of the reflective layer 182 is a metal, a reducibility of the metal is greater than the reducibility of hydrogen; when the material of the reflective layer 182 is an alloy, a reducibility of a metal in the alloy is greater than the reducibility of hydrogen. Specifically, the metal in the reflective layer 182 includes Al. Further, the metal in the reflective layer 182 may further include at least one of Ni, Cu, and La. In this embodiment, the material of the reflective layer 182 is Al/Ni/Cu/La alloy.

A material of the electrode layer 183 may be a transparent metal oxide such as indium tin oxide, indium zinc oxide, or tungsten oxide. In this embodiment, the material of the electrode layer 183 is tungsten oxide, to improve an ability of the electrode layer 183 to excite electrons.

The inventor of the present application found through experimental tests that in a panel structure without the hydrogen barrier layer 181, such as the organic light-emitting diode display panel 100' in FIG. 1, the electrical stability of the thin film transistor is poor, that is, a negative voltage bias of the threshold value of the thin film transistor is more serious, and the negative bias value of the threshold voltage can reach 5V to 9V. In this embodiment, the negative bias of the threshold voltage of the metal oxide thin film transistor 13 can be reduced to 1V by providing the hydrogen barrier layer 181. It can be seen that, in this embodiment, the arrangement of the hydrogen barrier layer 181 can significantly reduce the negative bias of the threshold voltage of the thin film transistor, to reduce a probability of an electrical property negative drift of the thin film transistor and improve the electrical stability of the thin film transistor.

In this embodiment, the dielectric insulating layer 14 is disposed between the gate electrode 133 and the source-drain electrode 134, and is in contact with the surface of the gate electrode 133 and the surface of the source-drain electrode 134, respectively. Since the arrangement of the hydrogen barrier layer 181 can prevent a generation of hydrogen ions in the organic planarization layer 17, that is, the diffusion of hydrogen ions into the channel 1311 is effectively avoided. Therefore, in this embodiment, there is no need to additionally dispose an aluminum oxide layer 40' on the surface of the dielectric insulating layer 14 to protect the channel 1311. Therefore, compared with the prior art structure in which the aluminum oxide layers 40' are disposed on the upper and lower surfaces of the dielectric insulating layer 14, the display panel 100 provided by the present embodiment has the following advantages: First, the present embodiment can eliminate an equipment cost which is required for manufacturing the aluminum oxide layer 40'. Second, avoid a loss of product yield due to a presence of foreign matter during the film formation of the aluminum oxide layer 40', to improve the product yield. Third, in the etching process of the dielectric insulating layer 14, there is no need to readjust the process parameters in the etching process, thereby reducing a burden on the production capacity.

The pixel definition layer 19 is disposed on a side of an anode 18 away from the organic planarization layer 17. The pixel definition layer 19 is provided with an opening 191 which exposes the anode 18. The light-emitting layer 20 is disposed in the opening 191. The cathode 21 is disposed on a side of the light-emitting layer 20 away from the anode 18. It should be noted that the specific structures and materials of the pixel definition layer 19, the light-emitting layer 20, and the cathode 21 can be referred to the prior art, and details are not described herein again.

The present application also provides a display device, and the display device can be a display product such as a mobile phone, a tablet, a notebook computer, and a TV. The display device includes a housing and a display panel disposed in the housing. The display panel may be the display panel 100 described in the foregoing embodiment, and the specific structure of the display panel 100 may refer to the description of the foregoing embodiment, and will not be repeated here.

Figure 3:
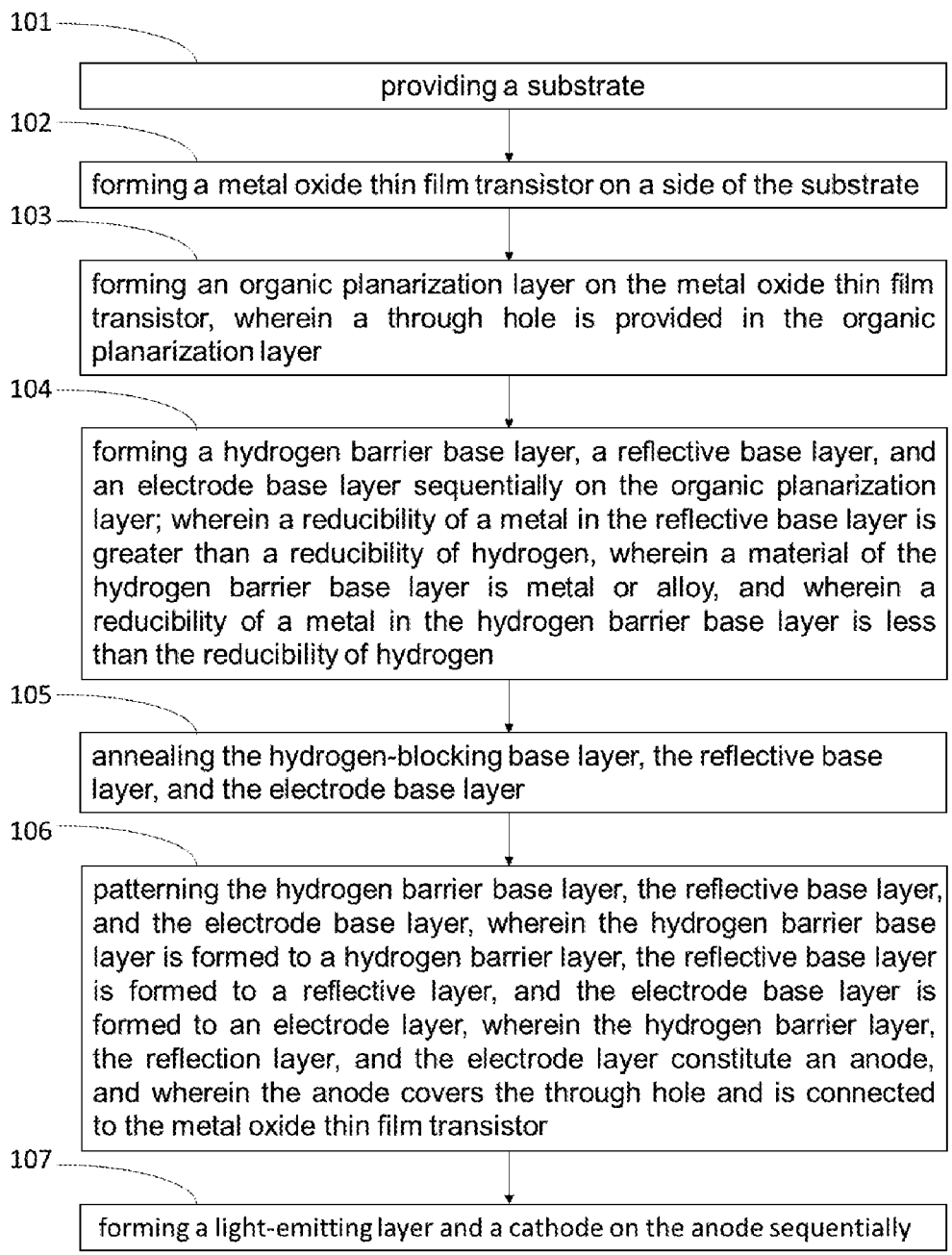
FIG. 3 is a schematic flowchart of a method of manufacturing the display panel provided by the present application.

Please refer to FIG. 3, the present application also provides a method of manufacturing a display panel, which includes the following steps:

101: providing a substrate;

102: forming a metal oxide thin film transistor on a side of the substrate;

103: forming an organic planarization layer on the metal oxide thin film transistor, wherein a through hole is provided in the organic planarization layer;

104: forming a hydrogen barrier base layer, a reflective base layer, and an electrode base layer sequentially on the organic planarization layer; wherein a reducibility of a metal in the reflective base layer is greater than a reducibility of hydrogen, wherein a material of the hydrogen barrier base layer is metal or alloy, and wherein a reducibility of a metal in the hydrogen barrier base layer is less than the reducibility of hydrogen;

105: annealing the hydrogen-blocking base layer, the reflective base layer, and the electrode base layer;

106: patterning the hydrogen barrier base layer, the reflective base layer, and the electrode base layer, wherein the hydrogen barrier base layer is formed to a hydrogen barrier layer, the reflective base layer is formed to a reflective layer, and the electrode base layer is formed to an electrode layer, wherein the hydrogen barrier layer, the reflection layer, and the electrode layer constitute an anode, and wherein the anode covers the through hole and is connected to the metal oxide thin film transistor;

107: forming a light-emitting layer and a cathode on the anode sequentially.

Therefore, in the method of manufacturing the display panel provided by the present application, a hydrogen barrier layer is provided between the organic planarization layer and the reflective layer, and the reducibility of the metal in the hydrogen barrier layer is smaller than that of hydrogen, compared with metals with strong reactivity that are more reducible than hydrogen, because the reactivity of the metal in the hydrogen barrier layer is weaker, therefore, under a high temperature process in the electrode layer film manufacturing process, the water in the organic planarization layer cannot be ionized to generate hydrogen ions, thereby preventing the hydrogen ions from diffusing into the channel and preventing the channel to be conducted, thereby reducing a probability of an electrical property negative drift of the thin film transistor and improving an electrical stability of the thin film transistor.

Figure 4A:
FIG. 4A to FIG. 4I are schematic structural diagrams obtained sequentially in each step in the manufacturing method of the display panel shown in FIG. 3.

Please refer to FIG. 3 and FIG. 4A to FIG. 4I, and the method of manufacturing the display panel 100 provided by the present application will be described in detail below through specific embodiments. The method of manufacturing the display panel 100 provided by the present application includes the following steps:

101: providing a substrate 10, as shown in FIG. 4A.

The substrate 10 may be a rigid substrate, such as a glass substrate; or, the substrate 10 may also be a flexible substrate, such as a polyimide substrate. The material of the substrate 10 is not specifically limited in the present application.

Figure 4B:
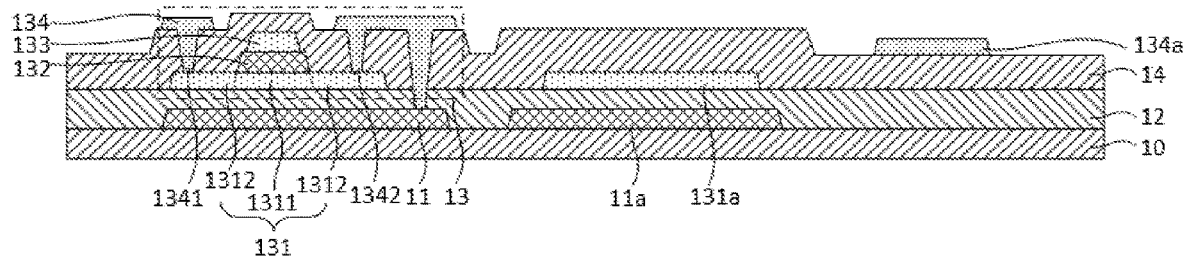

102: forming a metal oxide thin film transistor 13 on a side of the substrate 10, as shown in FIG. 4B.

Specifically, the metal oxide thin film transistor 13 is formed on the substrate 10. The metal oxide thin film transistor 13 includes an oxide semiconductor layer 131, a gate insulating layer 132, a gate electrode 133 and a source-drain electrode 134 formed in sequence. The oxide semiconductor layer 131 includes a channel 1311 and conduction portions 1312 provided on opposite sides of the channel 1311. The source-drain electrode 134 include a source electrode 1341 and a drain electrode 1342. The source electrode 1341 is connected to the conduction portion 1312 on a side of the channel 1311. The drain electrode 1342 is connected to the conduction portion 1312 on the other side of the channel 1311.

In this embodiment, a dielectric insulating layer 14 is further formed between the gate electrode 133 and the source-drain electrode 134, and the dielectric insulating layer 14 is in contact with a surface of the gate electrode 133 and a surface of the source-drain electrode 134 respectively. In addition, while the source-drain electrode 134 are formed, a bonding pad 134a in a bonding region is also formed.

It should be noted that, between steps 101 and 102, the manufacturing method of the display panel 100 further includes a step that forming the light-shielding electrode 11, the first conductive portion 11a, and the buffer layer 12 on the substrate 10 sequentially, which will not be repeated here.

103: forming an organic planarization layer 17 on the metal oxide thin film transistor 13, and providing a through hole 171 in the organic planarization layer 17.

Figure 4C:
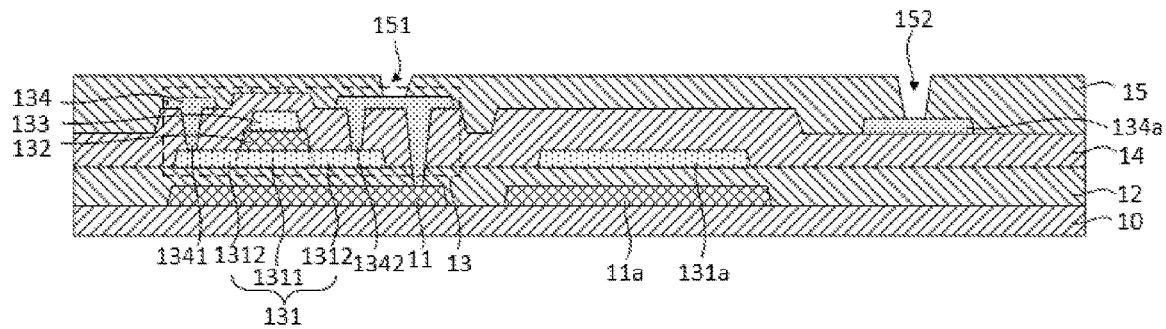
Figure 4D:
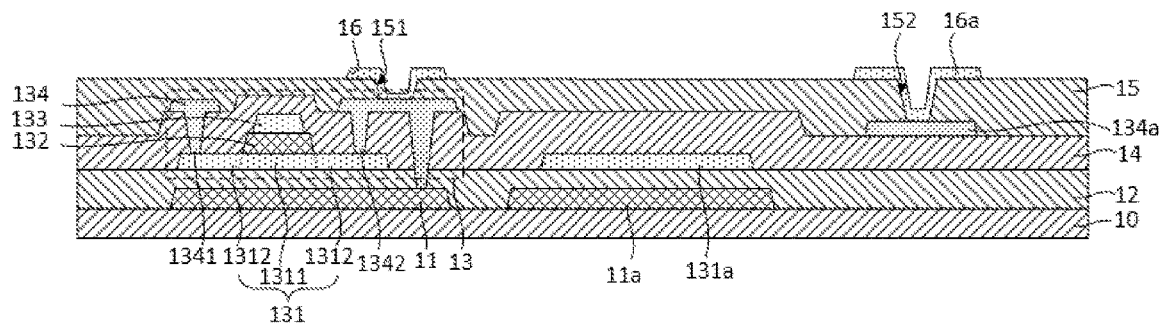
Figure 4E:
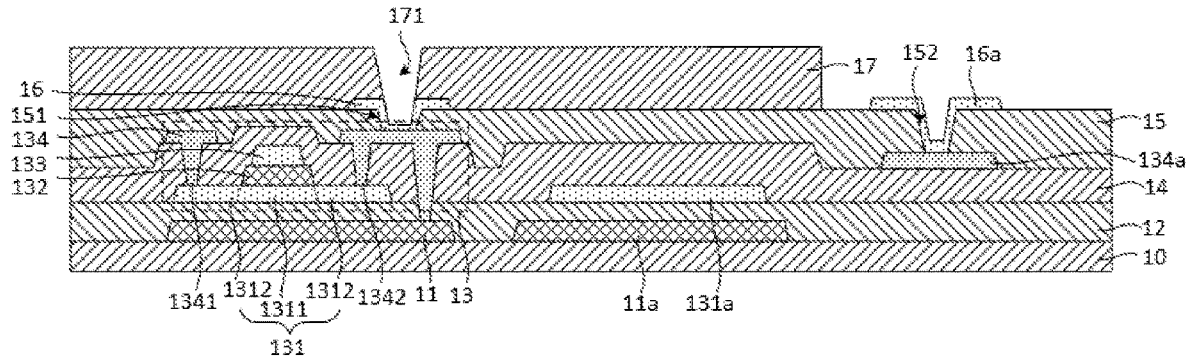

Referring to FIGS. 4C to 4E, step 103 specifically includes forming a passivation layer 15, a first protective electrode 16, a second protective electrode 16a, and an organic planarization layer 17 on the metal oxide thin film transistor 13 in sequence. The passivation layer 15 is formed with a first connection hole 151 exposing the drain electrode 1342 and a second connection hole 152 exposing the bonding pad 134a, as shown in FIG. 4C. The first protection electrode 16 covers the first connection hole 151 and is connected to the drain electrode 1342. The second protection electrode 16a extends into the second connection hole 152 and is connected to the bonding pad 134a, as shown in FIG. 4D. The organic planarization layer 17 is provided with the through hole 171 connected to the first connection hole 151, as shown in FIG. 4E.

Figure 4F:
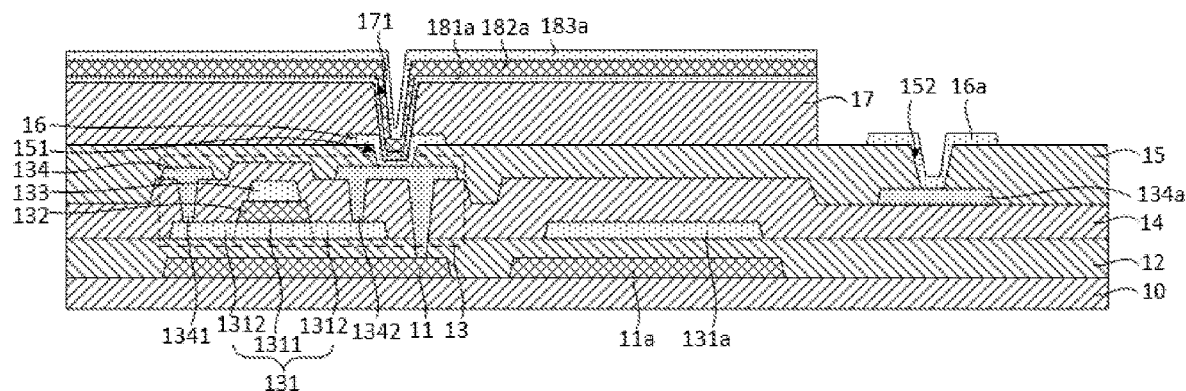

104: forming a hydrogen barrier base layer 181a, a reflective base layer 182a, and an electrode base layer 183a sequentially on the organic planarization layer 17. As shown in FIG. 4F. A reducibility of a metal in the reflective base layer 182a is greater than a reducibility of hydrogen, wherein a material of the hydrogen barrier base layer 181a is metal or alloy, and wherein a reducibility of a metal in the hydrogen barrier base layer 181a is less than the reducibility of hydrogen.

In this embodiment, the material of the hydrogen barrier base layer 181a is metal or alloy, and specifically, the hydrogen barrier base layer 181a may be formed by a physical vapor deposition process. The reducibility of the metal in the hydrogen barrier base layer 181a is smaller than the reducibility of hydrogen. Specifically, when the material of the hydrogen barrier base layer 181a is a metal, a reducibility of the metal is less than the reducibility of hydrogen; when a material of the hydrogen barrier base layer 181a is an alloy, the reducibility of at least one metal in the alloy is less than the reducibility of hydrogen.

The metal in the hydrogen barrier base layer 181a may include at least one of Mo, Ti, and Ni. In some specific embodiments, the material of the hydrogen barrier base layer 181a may be metal, such as Mo, Ti or Ni. In addition, in some specific embodiments, the material of the hydrogen barrier base layer 181a may also be an alloy, such as a Mo/Ti alloy, a Mo/Ni alloy or a Mo/Ti/Ni alloy. In this embodiment, the material of the hydrogen barrier base layer 181a is Mo/Ti/Ni alloy.

Further, a thickness of the hydrogen barrier base layer 181a may ranges from 300 angstroms to 2000 angstroms. In some embodiments, the thickness of the hydrogen barrier layer 181a may be 300 angstroms, 500 angstroms, 800 angstroms, 1000 angstroms, 1200 angstroms, 1500 angstroms, 1800 angstroms, or 2000 angstroms.

The material of the reflective base layer 182a may be a metal or an alloy, and specifically, a physical vapor deposition process may be used to form the reflective base layer 182a. When a material of the reflective base layer 182a is metal, a reducibility of the metal is greater than the reducibility of hydrogen; when a material of the reflective base layer 182a is an alloy, a reducibility of a metal in the alloy is greater than the reducibility of hydrogen. Specifically, the metal in the reflective base layer 182a includes Al. Further, the metal in the reflective base layer 182a may further include at least one of Ni, Cu, and La. In this embodiment, a material of the reflective base layer 182a is Al/Ni/Cu/La alloy.

A material of the electrode base layer 183a may be indium tin oxide or tungsten, and specifically, the electrode base layer 183a may be formed by a physical vapor deposition process. In this embodiment, a material of the electrode base layer 183a is tungsten.

105: annealing the hydrogen-blocking base layer 181a, the reflective base layer 182a, and the electrode base layer 183a, as shown in FIG. 4F.

Specifically, in an oxygen atmosphere, performing an annealing treatment to a chamber where the hydrogen barrier base layer 181a, the reflective base layer 182a, and the electrode base layer 183a are positioned in to oxidize tungsten in the electrode base layer 183a to form tungsten oxide. The material of the hydrogen barrier base layer 181a and the material of the reflective base layer 182a are not affected by oxygen.

Figure 4G:
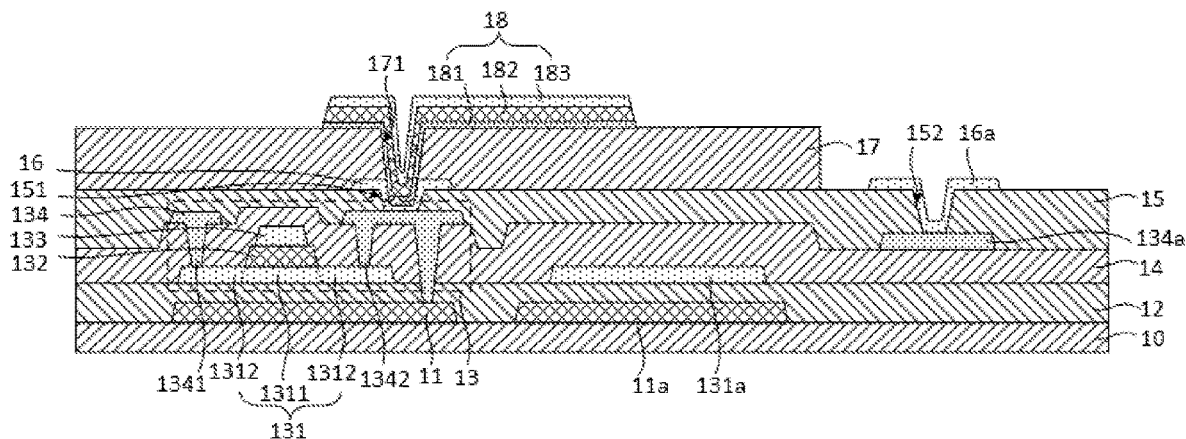

106. patterning the hydrogen barrier base layer 181a, the reflective base layer 182a, and the electrode base layer 183a, wherein the hydrogen barrier base layer 181a is formed to a hydrogen barrier layer 181, the reflective base layer 182a is formed to a reflective layer 182, and the electrode base layer 183a is formed to an electrode layer 183, wherein the hydrogen barrier layer 181, the reflection layer 182, and the electrode layer 183 constitute an anode 18, and wherein the anode 18 covers the through hole 171 and is connected to the metal oxide thin film transistor 13, as shown in FIG. 4G.

Step 106 specifically includes the following steps: First, the electrode base layer 183a is etched separately by a dry etching process to form the electrode layer 183. Secondly, the reflective base layer 182a and the hydrogen barrier base layer 181a are etched under a same etching process, to form the reflective layer 182 and the hydrogen barrier layer 181, respectively. In the wet etching process, the reflective base layer 182a and the hydrogen barrier base layer 181a are in a same etching solution environment, for example, in the system where the aluminate etching solution is positioned, thereby avoiding reducing a complexity of a manufacturing process of the anode 18.

To sum up, in this embodiment, compared to a high activity metal which has a greater reducibility than the hydrogen, a metal in the hydrogen barrier layer 181 has a weaker activity. Even under high temperature conditions, a contact between the hydrogen barrier layer 181 and the organic planarization layer 17 will not cause the water in the organic planarization layer 17 to be ionized to form hydrogen ions, which can effectively prevent the hydrogen ions from diffusing into the channel 1311, thereby preventing the channel 1311 from being conductive, and reducing a probability of an electrical property negative drift of the metal oxide thin film transistor 13, thereby improving an electrical stability of the metal oxide thin film transistor 13.

The inventor of the present application found through experimental tests that in a panel structure without the hydrogen barrier layer 181, such as the organic light-emitting diode display panel 100' in FIG. 1, the electrical stability of the thin film transistor is poor, that is, a negative voltage bias of the threshold value of the thin film transistor is more serious, and the negative bias value of the threshold voltage can reach 5V to 9V. In this embodiment, the negative bias of the threshold voltage of the metal oxide thin film transistor 13 can be reduced to 1V by providing the hydrogen barrier layer 181. It can be seen that, in this embodiment, the arrangement of the hydrogen barrier layer 181 can significantly reduce the negative bias of the threshold voltage of the thin film transistor, to reduce a probability of the electrical property negative drift of the thin film transistor and improve the electrical stability of the thin film transistor.

Further, in this embodiment, the hydrogen barrier layer 181 is disposed between the organic planarization layer 17 and the reflective layer 182, so there is no need to additionally dispose an aluminum oxide layer 40' on the surface of the dielectric insulating layer 14 to protect the channel 1311, as described in step 102 above. Therefore, compared with the prior art structure in which the aluminum oxide layers 40' are disposed on the upper and lower surfaces of the dielectric insulating layer 14, the display panel 100 provided by this embodiment has the following advantages: First, the present embodiment can eliminate an equipment cost which is required for manufacturing the aluminum oxide layer 40'. Second, avoid a loss of product yield due to a presence of foreign matter during the film formation of the aluminum oxide layer 40', to improve the product yield. Third, in the etching process of the dielectric insulating layer 14, there is no need to readjust the process parameters in the etching process, thereby reducing a burden on the production capacity.

Figure 4H:
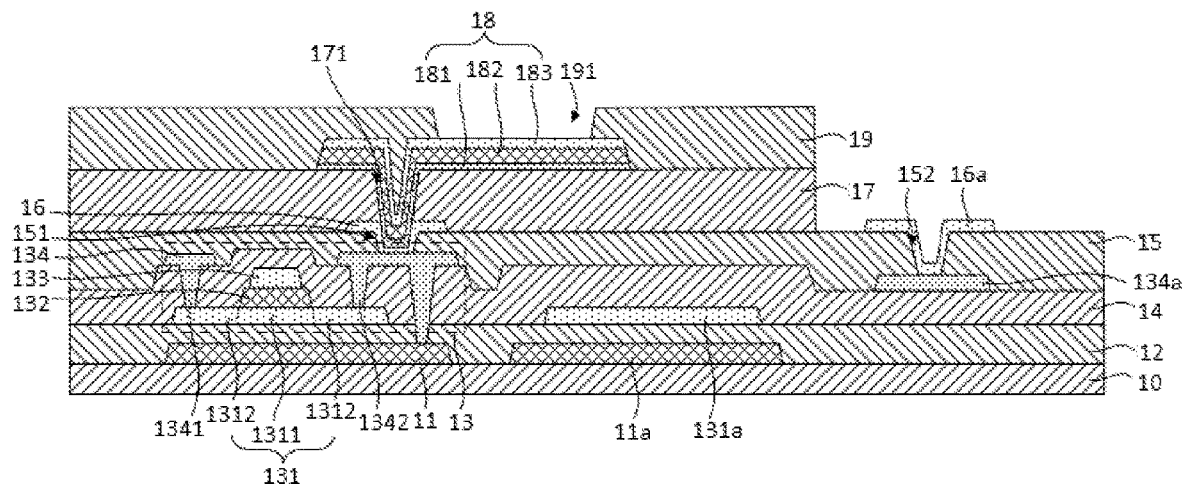

After step 106, the manufacturing method of the display panel 100 further includes the step of manufacturing the pixel definition layer 19 on the anode 18, wherein the pixel definition layer 19 is formed with an opening 191 exposing the anode 18, as shown in FIG. 4H.

Figure 4I:
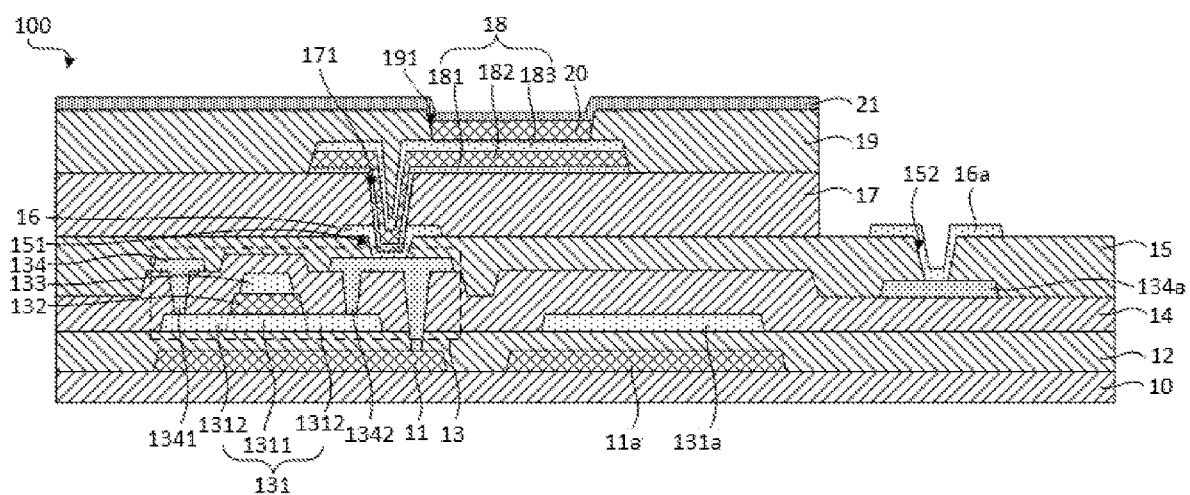

107. forming a light-emitting layer 20 and a cathode 21 on the anode 18 in sequence, as shown in FIG. 4I.

A material and a manufacturing method of the light-emitting layer 20 and a material and a manufacturing method of the cathode 21 can all refer to the prior art, and are not described herein again.

A display panel, a manufacturing method thereof, and a display device provided by the embodiments of the present application have been described in detail above. The principles and implementations of the present application are described with specific examples. The descriptions of the above embodiments are only for the purpose of help to understand the method of the present application and its core idea. Meanwhile, for those skilled in the art, according to the idea of the present application, there will be changes in a specific implementation and an application scope. In summary, the content of this specification should not be understood as a limitation of the present application.

What is claimed is:

1. A display panel, comprising:
a substrate;
a metal oxide thin film transistor disposed on the substrate;
an organic planarization layer disposed on a side of the metal oxide thin film transistor away from the substrate, wherein a through hole is provided in the organic planarization layer;
an anode disposed on a side of the organic planarization layer away from the metal oxide thin film transistor, wherein the anode covers the through hole, and wherein the anode is connected to the metal oxide thin film transistor;
a light-emitting layer disposed on a side of the anode away from the organic planarization layer; and
a cathode disposed on a side of the light-emitting layer away from the anode;
wherein the anode comprises a hydrogen barrier layer, a reflective layer, and an electrode layer sequentially disposed on the organic planarization layer, wherein a reducibility of a metal in the reflective layer is greater than a reducibility of hydrogen, wherein a material of the hydrogen barrier layer is metal or alloy, and wherein a reducibility of a metal in the hydrogen barrier layer is less than the reducibility of hydrogen.

2. The display panel according to claim 1, wherein the metal in the hydrogen barrier layer comprises at least one of Mo, Ti and Ni.

3. The display panel according to claim 2, wherein the material of the hydrogen barrier layer comprises Mo/Ti alloy, Mo/Ni alloy or Mo/Ti/Ni alloy.

4. The display panel according to claim 2, wherein the metal in the reflective layer comprises Al.

5. The display panel according to claim 4, wherein the metal in the reflective layer further comprises at least one of Ni, Cu, and La.

6. The display panel according to claim 5, wherein the material of the reflective layer comprises Al/Ni/Cu/La alloy, and wherein the material of the hydrogen barrier layer comprises Mo/Ni/Ti alloy.

7. The display panel according to claim 6, wherein the display panel further comprises a passivation layer and a first protective electrode, wherein the passivation layer is disposed between the metal oxide thin film transistor and the organic planarization layer, wherein a first connection hole is provided in the passivation layer, wherein the first protection electrode is disposed between the passivation layer and the organic planarization layer, wherein the first protection electrode covers the first connection hole, and wherein the first protection electrode connected to the anode and the metal oxide thin film transistor respectively.

8. The display panel according to claim 7, wherein the material of the first protective electrode is Ti.

9. The display panel according to claim 1, wherein when the material of the hydrogen barrier layer is a metal, a reducibility of the metal is less than the reducibility of hydrogen, and wherein when the material of the hydrogen barrier layer is an alloy, a reducibility of at least one metal in the alloy is less than the reducibility of hydrogen.

10. The display panel according to claim 1, wherein a thickness of the hydrogen barrier layer ranges from 300 angstroms to 2000 angstroms.

11. The display panel according to claim 1, wherein when a material of the reflective layer is a metal, a reducibility of the metal is greater than the reducibility of hydrogen, and wherein when the material of the reflective layer is alloy, a reducibility of a metal in the alloy is greater the reducibility of hydrogen.

12. The display panel according to claim 1, wherein the metal oxide thin film transistor comprises an oxide semiconductor layer, a gate insulating layer, a gate electrode and a source-drain electrode which are sequentially disposed on the substrate; wherein the display panel further comprises a dielectric insulating layer disposed between the gate electrode and the source-drain electrode, and wherein the dielectric insulating layer is in contact with surfaces of the gate electrode and the source-drain electrode, respectively.

13. A display device comprising a housing and a display panel disposed in the housing, wherein the display panel comprises:
a substrate;
a metal oxide thin film transistor disposed on the substrate;
an organic planarization layer disposed on a side of the metal oxide thin film transistor away from the substrate, wherein a through hole is provided in the organic planarization layer;
an anode disposed on a side of the organic planarization layer away from the metal oxide thin film transistor, wherein the anode covers the through hole, and wherein the anode is connected to the metal oxide thin film transistor;
a light-emitting layer disposed on a side of the anode away from the organic planarization layer; and
a cathode disposed on a side of the light-emitting layer away from the anode;
wherein the anode comprises a hydrogen barrier layer, a reflective layer, and an electrode layer sequentially disposed on the organic planarization layer, wherein a reducibility of a metal in the reflective layer is greater than a reducibility of hydrogen, wherein a material of the hydrogen barrier layer is metal or alloy, and wherein a reducibility of a metal in the hydrogen barrier layer is less than the reducibility of hydrogen.

14. The display device according to claim 13, wherein the metal in the hydrogen barrier layer comprises at least one of Mo, Ti and Ni.

15. The display device according to claim 14, wherein the material of the hydrogen barrier layer comprises Mo/Ti alloy, Mo/Ni alloy or Mo/Ti/Ni alloy.

16. The display device according to claim 14, wherein the metal in the reflective layer comprises Al.

17. The display device according to claim 16, wherein the metal in the reflective layer further comprises at least one of Ni, Cu, and La.

18. The display device according to claim 17, wherein the material of the reflective layer comprises Al/Ni/Cu/La alloy, and wherein the material of the hydrogen barrier layer comprises Mo/Ni/Ti alloy.

19. A method of manufacturing a display panel, comprising the following steps:
providing a substrate;
forming a metal oxide thin film transistor on a side of the substrate;
forming an organic planarization layer on the metal oxide thin film transistor, wherein a through hole is provided in the organic planarization layer;
forming a hydrogen barrier base layer, a reflective base layer, and an electrode base layer sequentially on the organic planarization layer; wherein a reducibility of a metal in the reflective base layer is greater than a reducibility of hydrogen, wherein a material of the hydrogen barrier base layer is metal or alloy, and wherein a reducibility of a metal in the hydrogen barrier base layer is less than the reducibility of hydrogen;
annealing the hydrogen barrier base layer, the reflective base layer, and the electrode base layer;
patterning the hydrogen barrier base layer, the reflective base layer, and the electrode base layer, wherein the hydrogen barrier base layer is formed to a hydrogen barrier layer, the reflective base layer is formed to a reflective layer, and the electrode base layer is formed to an electrode layer, wherein the hydrogen barrier layer, the reflection layer, and the electrode layer constitute an anode, and wherein the anode covers the through hole and is connected to the metal oxide thin film transistor; and
forming a light-emitting layer and a cathode sequentially on the anode sequentially.

20. The method of manufacturing the display panel according to claim 19, wherein a material of the reflective base layer comprises Al/Ni/Cu/La alloy, a material of the hydrogen barrier base layer comprises Mo/Ni/Ti alloy, and wherein the step of patterning the hydrogen barrier base layer, the reflective base layer, and the electrode base layer comprises:
etching the electrode base layer by a dry etching process to form the electrode layer; and
etching the reflective base layer and the hydrogen barrier base layer under a same wet etching process to form the reflective layer and the hydrogen barrier layer, respectively.

* * * * *